United States Patent [19]

Kotowski

[11] 4,333,120

[45] Jun. 1, 1982

[54] TRANSISTOR PROTECTION CIRCUIT

[75] Inventor: Thomas W. Kotowski, Noblesville, Ind.

[73] Assignee: General Motors Corporation, Detroit, Mich.

[21] Appl. No.: 125,147

[22] Filed: Feb. 27, 1980

[51] Int. Cl.³ .......................... H02H 3/38; H02H 7/20
[52] U.S. Cl. ........................................ 361/79; 361/98; 361/91; 330/298; 330/207 P
[58] Field of Search ..................... 361/18, 93, 98, 103, 361/79; 330/298, 207 P; 307/310, 302, 297

[56] References Cited

U.S. PATENT DOCUMENTS

| | | | |
|---|---|---|---|
| 3,609,413 | 9/1971 | Lane et al. | 361/91 X |
| 3,895,286 | 7/1975 | Steckler | 307/310 X |
| 4,021,701 | 5/1977 | Davies | 361/18 |
| 4,042,889 | 8/1977 | Baker | 330/298 X |
| 4,074,334 | 2/1978 | D'Arrigo et al. | 330/298 X |
| 4,270,159 | 5/1981 | Buckle | 361/79 |

*Primary Examiner*—Patrick R. Salce
*Attorney, Agent, or Firm*—Howard N. Conkey

[57] ABSTRACT

A protection circuit for an output transistor includes a transistor having two discrete emitter regions and which is responsive to both the voltage across the protected transistor and its drive current to provide both short circuit and overcurrent protection for the output transistor.

1 Claim, 1 Drawing Figure

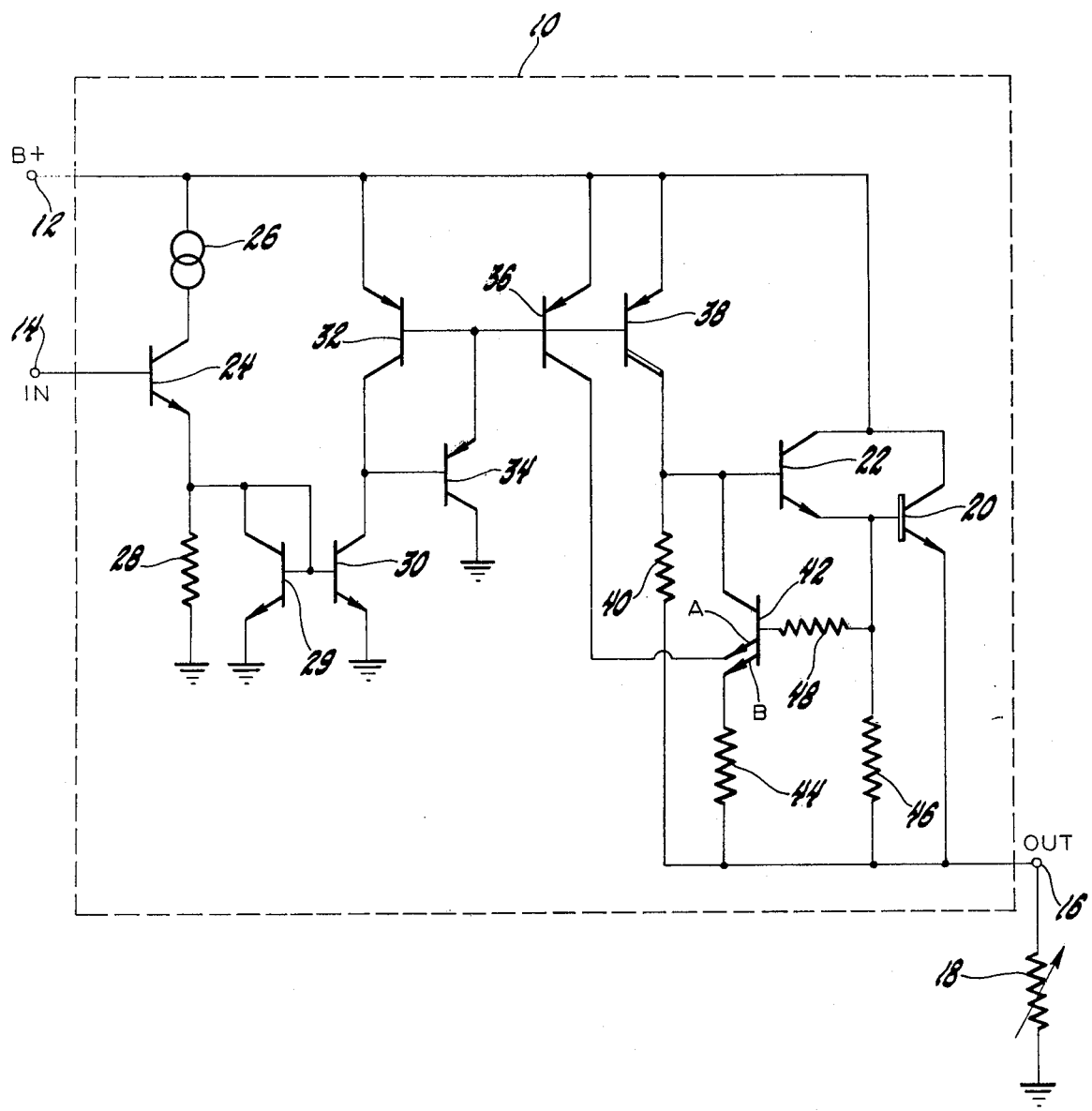

TRANSISTOR PROTECTION CIRCUIT

This invention relates to a protection circuit for an output power transistor.

It is well known that transistors are susceptible to permanent damage when they are subjected to excessive power dissipation. It is desirable in systems employing power transistors to prevent their operation in fault modes which could result in permanent damage so that upon correction of the faulted condition, the device may resume operation. This is particularly applicable to integrated circuits where a damaged component cannot be replaced without replacing the complete circuit. Further, it is desirable to provide for a protection circuit which requires minimum number of components and area on the integrated circuit.

It is the general object of this invention to provide for an improved short and overcurrent protection circuit for an output power transistor.

It is another object of this invention to provide for a short and overcurrent protection circuit for an output power transistor having fewer circuit components to provide the protection functions.

It is another object of this invention to provide for a short and overcurrent protection circuit for an output transistor employing a single protection device comprised of a transistor having two discrete emitter regions.

These and other objects of this invention may be best understood by reference to the single figured drawing which illustrates an integrated power switching circuit incorporating the protection circuit of this invention to protect the output power transistor.

Referring to the FIGURE, there is illustrated a power switch in the form of a bipolar monolithic integrated circuit 10. The integrated circuit 10 receives power at a power input terminal 12 and responds to a drive signal applied to an input terminal 14 to switch the voltage at the power input terminal 12 to an output terminal 16 and across an external load represented by a variable resistance 18 connected between the output terminal 16 and ground.

The power switch in the integrated circuit 10 is basically comprised of an output power NPN transistor 20 and an NPN driver transistor 22 connected in a Darlington configuration. In response to a bias current applied to the base of the transistor 22, the power transistor 20 is biased conductive to couple the voltage at the power input terminal 12 across the load 18. The load may take the form of a winding of a stepper motor.

The circuitry for biasing the transistors 20 and 22 conductive in response to a drive signal at the input terminal 14 includes an NPN transistor 24 whose collector is coupled to the positive voltage terminal 12 through a current source 26. The emitter of the transistor 24 is coupled to a grounded substrate through a load resistor 28. When the transistor 24 is biased conductive by an input signal applied to the input terminal 14, it supplies current to a current mirror comprised of NPN transistors 29 and 30. The current mirror is conventional in form and functions to provide bias current to a series of PNP transistors 32, 34, 36 and 38.

The emitter and collector of the transistor 32 are coupled between the power input terminal 12 and the collector of the transistor 30 in the current mirror. The emitter and collector of the transistor 34 are coupled between the common base of the transistors 32, 36 and 38 and the grounded substrate of the integrated circuit 10. The emitter-base junction of each of the transistors 36 and 38 are coupled in parallel with the emitter-base junction of the transistor 32. The base of the transistor 34 is coupled to the collector of the transistor 30. When the transistor 30 conducts in response to a drive signal applied to the terminal 14, the transistors 36 and 38 conduct (when conduction paths are provided) with the currents being established at a level determined by the current mirror.

The bias current supplied by the PNP transistor 38 is effective to bias the output transistors 20 and 22 conductive to couple the voltage at the input voltage terminal 12 to the output terminal 16 and across the load 18. In this respect, the collector of the transistor 38 is coupled to the base of the transistor 22 and to the emitter of the transistor 20 through a load resistor 40 and a resistor 41 is coupled between the base and emitter of the transistor 20 to assure that an "on" signal above a certain minimum current flow is required to bias the transistor 20 conductive. Through the circuit described, the load may be selectively energized by selective application of a control voltage to the input terminal 14.

If the output terminal 16 were shorted to ground potential or if the impedance of the load 18 decreased so that the current to the output transistor increased to an excessive value, the transistor 20 may be permanently damaged by the excess power dissipated therein. In order to protect against a short circuit or overcurrent condition, and in accord with this invention, a protection transistor 42 is provided which protects the output transistor 20 against both of these conditions. The protection transistor 42 has two discrete emitter regions which are two separate shallow N-type islands disposed within a larger deeper P-type island which forms a base region. The larger island is inset in an N-type semiconductor surface which forms the collector. The collector of the transistor 42 is coupled to the base of the transistor 22 and the emitter identified as A in the drawing is coupled to the collector of the transistor 36. The second emitter of the transistor 42 and which is identified as B in the drawing is coupled to the output terminal 16 through a temperature compensating resistor 44 whose function will hereinafter be described.

The voltage across the collector and emitter of the output power transistor 20 appears across the series combination including the emitter-collector of the transistor 36, the reverse biased junction formed by the emitter A and the base of the transistor 42, the base-emitter junction formed by the base and emitter B, and the resistor 44. The saturation voltage of the transistor 36, the Zener breakdown voltage of the NP junction formed by the emitter A and base of the transistor 42 and the forward breakdown voltage of the PN junction formed by the base and emitter B of the transistor 42 is a predetermined value less than the voltage applied to the power input terminal 12. During normal operation, the voltage across the output transistor 20 is substantially zero when it is biased conductive in response to an input signal at the terminal 14 and the Zener diode formed by the emitter A and the base of the transistor 42 does not conduct. However, when the output terminal 16 is shorted to ground and the voltage across the collector and emitter of the transistor 20 increases to substantially the voltage applied to the terminal 12, the Zener diode formed by emitter A and base of the transistor 42 conducts to supply base current for the transistor 42 which conducts between its collector and emitter B. Conduction of the transistor 42 bypasses the base drive current of the transistor 22 to the output terminal 16 resulting in the output power transistor 20 being biased nonconductive. Excessive power dissipation and damage to the transistor 20 is thereby prevented.

To provide for overcurrent protection when a short circuit condition does not exist but when the value of the load 18 is such that the current through the output transistor 20 approaches a value which may result in permanent damage, the transistor 42 monitors the drive signal of the output transistor 20. The base of the transistor 20 is coupled to the base of the transistor 42 through a resistor 48. As the drive current increases, the base-emitter voltage of the output transistor and the transistor 42 increases. When the base bias of the transistor 20 reaches a critical value indicative of an overcurrent condition, the transistor 42 conducts between its collector and emitter B. The conduction of the transistor 42 shunts drive current away from the transistor 22 to decrease the conduction of the transistor 20 and thereby limit current therethrough to a safe level.

The transistor 20 is illustrated in the drawing as an idealized transistor. In actuality, the transistor 20 has some emitter, base and collector series resistance associated with it. It is the emitter series resistance that dominates the behavior of the emitter-base voltage of the transistor 20 under high current conditions. Therefore, temperature compensation of the circuit depends on tracking the temperature characteristics of the emitter series resistance of the transistor 20. Approximate temperature compensation could be obtained by using a base diffusion type resistor for resistor 44. However, because base and emitter resistors are made at different times by different processes, the fluctuations in the values of a base resistor associated with processing would not track the fluctuations associated with the processing of emitter resistors. In accord with this invention, temperature compensation is provided by the emitter resistor 44 which is comprised of a diffused area formed at the same time as the emitter region of the transistor 20 and by the same process so as to track both the processing variations and temperature fluctuations of the emitter characteristics of the transistor 20. By use of this emitter resistor, improved compensation for variations in the operation of the transistor 20 in response to temperature variations is provided.

The foregoing description of a preferred embodiment for the purposes of illustrating the invention is not to be considered as limiting or restricting the invention since many modifications may be made by a person skilled in the art without departing from the scope of the invention.

The embodiments of the invention in which an exclusive property or privilege is claimed are defined as follows:

1. A bipolar monolithic integrated short circuit and overcurrent protection circuit for an output transistor having an emitter, a base and a collector, the emitter and collector being coupled between a positive voltage terminal and an output terminal and the output transistor having temperature responsive emitter resistance that dominates the behavior of the base-emitter voltage of the output transistor under high current conditions, the protection circuit comprising:

a protection transistor having a first conductivity type collector, a second conductivity type base in contact with the collector and first and second emitters of the first conductivity type displaced from each other in contact with the base to form first and second emitter-base junctions, respectively;

circuit means effective to sense a predetermined voltage value between the positive voltage terminal and the output terminal representing a short circuit condition of the output terminal, the circuit means including means effective to couple the first emitter of the protection transistor to the collector of the output transistor, means including a diffused area emitter resistor effective to couple the second emitter of the protection transistor to the emitter of the output transistor, the diffused area emitter resistor having temperature responsive characteristics substantially equal to the temperature responsive characteristics of the emitter resistance of the output transistor, one of the first and second emitter-base junctions being forward biased and the other one of the first and second emitter-base junctions being reverse biased, the reverse biased emitter-base junction of the protection transistor breaking down and supplying current through the forward biased emitter-base junction to bias the protection transistor conductive when the output terminal voltage decreases to a value below the voltage at the positive voltage terminal by the predetermined voltage value representing a short circuit condition of the output terminal;

means effective to couple the collector of the protection transistor to shut drive signals provided to the output transistor when said protection transistor is biased conductive; and means effective for all values of voltages across the output transistor to continuously apply the voltage at the base of the output transistor to the base of the protection transistor to variably control conduction of the protection transistor to limit the current through the output transistor, whereby the current limit is varied in accord with the temperature responsive characteristics of the diffused area emitter resistor to compensate for variations in the base-emitter voltage of the output transistor due to the emitter series resistance of the output transistor.

* * * * *

UNITED STATES PATENT AND TRADEMARK OFFICE
CERTIFICATE OF CORRECTION

PATENT NO. : 4,333,120
DATED : June 1, 1982
INVENTOR(S) : Thomas W. Kotowski

It is certified that error appears in the above—identified patent and that said Letters Patent is hereby corrected as shown below:

In the claim, column 4, line 43, "shut" should read -- shunt --.

Signed and Sealed this

Seventh Day of September 1982

[SEAL]

Attest:

*Attesting Officer*

GERALD J. MOSSINGHOFF

*Commissioner of Patents and Trademarks*